US009931838B2

(12) United States Patent
Lee et al.

(10) Patent No.: US 9,931,838 B2
(45) Date of Patent: Apr. 3, 2018

(54) METHOD OF CONTROLLING FILM THICKNESS DISTRIBUTION AND METHOD OF MANUFACTURING DISPLAY APPARATUS USING THE METHOD

(71) Applicants: SAMSUNG DISPLAY CO., LTD., Yongin-si, Gyeonggi-do (KR); SAMSUNG ELECTRONICS CO., LTD., Suwon-si, Gyeonggi-do (KR)

(72) Inventors: Dongjun Lee, Yongin-si (KR); Minsoo Kim, Yongin-si (KR); Jongwon Kim, Yongin-si (KR); Seungdon Lee, Hwasung (KR); Hyunjin Lee, Hwasung (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/254,019

(22) Filed: Sep. 1, 2016

(65) Prior Publication Data
US 2017/0266957 A1 Sep. 21, 2017

(30) Foreign Application Priority Data

Mar. 21, 2016 (KR) ........................ 10-2016-0033307

(51) Int. Cl.
| | |
|---|---|
| B41J 2/045 | (2006.01) |
| H01L 51/56 | (2006.01) |
| H01L 51/52 | (2006.01) |
| H01L 27/32 | (2006.01) |
| G02F 1/133 | (2006.01) |

(Continued)

(52) U.S. Cl.
CPC ....... *B41J 2/04541* (2013.01); *B41J 2/04586* (2013.01); *G02F 1/1337* (2013.01); *G02F 1/1341* (2013.01); *G02F 1/13306* (2013.01); *H01L 27/3244* (2013.01); *H01L 51/5253* (2013.01); *H01L 51/56* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 7,575,774 | B2 | 8/2009 | Suzuki et al. |
| 7,639,334 | B2 | 12/2009 | Iwato et al. |
| 7,646,458 | B2 | 1/2010 | Onda |

(Continued)

FOREIGN PATENT DOCUMENTS

| | | |
|---|---|---|
| JP | 2004-295092 A | 10/2004 |
| JP | 2009-189928 A | 8/2009 |

(Continued)

*Primary Examiner* — Duy T Nguyen
*Assistant Examiner* — Bo Bin Jang
(74) *Attorney, Agent, or Firm* — Lee & Morse, P.C.

(57) ABSTRACT

An inkjet printing method includes: setting a first region to be printed at a constant print density within a target region to be printed; setting a second region within the target region and closer than the first region to an edge of the target region, wherein the second region is to be printed at a print density that varies according to a position; generating control data for a plurality of nozzles provided on an inkjet head in order to print the first region and the second region; and driving the inkjet head according to the control data.

19 Claims, 13 Drawing Sheets

(51) Int. Cl.
    *G02F 1/1337*     (2006.01)
    *G02F 1/1341*     (2006.01)

(56) References Cited

U.S. PATENT DOCUMENTS

| | | |
|---|---|---|
| 8,995,022 B1 | 3/2015 | Vronsky et al. |
| 2005/0079644 A1 | 4/2005 | Sakurada |
| 2011/0090273 A1* | 4/2011 | Miyazaki ............ B41J 2/04553 347/10 |

FOREIGN PATENT DOCUMENTS

| | | |
|---|---|---|
| JP | 2013-063573 A | 4/2013 |
| KR | 10-2007-0010847 A | 1/2007 |
| KR | 10-2007-0043631 A | 4/2007 |
| KR | 10-2008-0073230 A | 8/2008 |
| KR | 10-0861433 B1 | 10/2008 |

* cited by examiner

| 1 | 1 | 0.6 | 0.6 | 0.2 | 0.2 |
|---|---|-----|-----|-----|-----|
| 1 | 1 | 0.6 | 0.6 | 0.2 | 0.2 |
| 1 | 1 | 0.6 | 0.6 | 0.2 | 0.2 |
| 1 | 1 | 0.6 | 0.6 | 0.2 | 0.2 |
| 1 | 1 | 0.6 | 0.6 | 0.2 | 0.2 |
| 1 | 1 | 0.6 | 0.6 | 0.2 | 0.2 |
| 1 | 1 | 0.6 | 0.6 | 0.2 | 0.2 |

| 1 | 1 | 1 | 1 | 1 | 1 |
|---|---|---|---|---|---|
| 0 | 0 | 0 | 0 | 1 | 1 |
| 1 | 1 | 1 | 1 | 1 | 1 |
| 0 | 0 | 0 | 0 | 1 | 1 |
| 1 | 1 | 1 | 1 | 1 | 1 |
| 0 | 0 | 0 | 0 | 1 | 1 |
| 1 | 1 | 1 | 1 | 1 | 1 |

METHOD OF CONTROLLING FILM THICKNESS DISTRIBUTION AND METHOD OF MANUFACTURING DISPLAY APPARATUS USING THE METHOD

CROSS-REFERENCE TO RELATED APPLICATION

Korean Patent Application No. 10-2016-0033307, filed on Mar. 21, 2016, in the Korean Intellectual Property Office, and entitled: "Inkjet Printing Method and Method of Manufacturing Display Apparatus Using the Method," is incorporated by reference herein in its entirety.

BACKGROUND

1. Field

Embodiments relate to a method of forming a thin film that controls film thickness distribution and a method of manufacturing a display apparatus using the same.

2. Description of the Related Art

An inkjet printing method may be used in various applications, for example, to form an alignment film of a liquid crystal display apparatus or an encapsulation film of an organic light-emitting display apparatus.

SUMMARY

Embodiments are directed to a method of manufacturing a display apparatus, the method including forming display devices in an array on a display substrate; and encapsulating the display substrate, encapsulating the display substrate including setting a first region to be printed at a constant print density within a target region to be printed; setting a second region to be printed at a print density that varies according to position, wherein the second region is closer than the first region to an edge of the target region; generating control data for a plurality of nozzles provided on an inkjet head in order to print the first region and the second region; and driving the inkjet head according to the control data.

The display devices may be organic light-emitting devices.

Embodiments are also directed to a method of manufacturing a display apparatus, the method including forming a pixel circuit for controlling a display region and forming a pixel electrode on a first substrate; and forming a first alignment film on the first substrate, forming the first alignment film on the first substrate including setting a first region to be printed at a constant print density within a target region to be printed; setting a second region to be printed at a print density that varies according to position, wherein the second region is closer than the first region to an edge of the target region; generating control data for a plurality of nozzles provided on an inkjet head in order to print the first region and the second region; and driving the inkjet head according to the control data.

The method may further include forming a second alignment film on a second substrate in the same manner as the first alignment film; and forming a liquid crystal layer between the first substrate and the second substrate.

Embodiments are also directed to an inkjet printing method for controlling film thickness distribution, the method including setting a first region to be printed at a constant print density within a target region to be printed; setting a second region within the target region and closer than the first region to an edge of the target region, wherein the second region is to be printed at a print density that varies according to position; generating control data for a plurality of nozzles provided on an inkjet head in order to print the first region and the second region; and driving the inkjet head according to the control data so as to print the first and second regions.

The print density of the second region may be less than the print density of the first region.

The target region may be a region of a display substrate, the edge of the target region may correspond to a bezel area of the display substrate, and the print density of the second region may decrease toward the edge of the target region.

The first region and the second region may be divided into a plurality of unit regions facing the plurality of nozzles provided on the inkjet head, and the control data may be data for controlling intervals or volumes of droplets to be discharged onto the plurality of unit regions.

The generating of the control data may include setting a standard driving voltage, which satisfies a predetermined standard discharge amount tolerance range, for the plurality of nozzles provided on the inkjet head.

The generating of the control data may include generating control data for printing the first region in a matrix form in which values of the standard driving voltages respectively set for the plurality of nozzles are assigned to a row of the matrix so that a first direction in which the plurality of nozzles are disposed is defined as a direction of the row and the row is repeatedly disposed in a second direction in which the inkjet head moves relative to the target region.

The generating of the control data may further include selecting a print density varying operation for the second region.

The print density varying operation may include a droplet volume adjusting operation, a printing interval adjusting operation, or a combination thereof.

The droplet volume adjusting operation may be selected, and the generating of the control data may further include setting a ratio of an amount of droplets to be discharged onto the plurality of unit regions of the second region to a standard discharge amount.

The generating of the control data may further include generating control data for printing the second region by using data in a matrix form obtained by multiplying the ratio set for each of the plurality of unit regions of the second region by the standard driving voltage set for the plurality of nozzles facing the plurality of unit regions.

The printing interval adjusting operation may be selected, and the generating of the control data may further include setting an interval ratio of an interval of discharging droplets onto the second region to an interval between droplets to be discharged onto the first region.

The generating of the control data may further include generating bitmap data indicating unit regions onto which droplets are to be discharged, from among the plurality of unit regions of the second region, the data having values of 1 and 0 according to the interval ratio.

The generating of the control data may further include generating control data for printing the second region by using data in a matrix form obtained by multiplying the bitmap data generated for each of the plurality of unit regions of the second region by the standard driving voltage set for the plurality of nozzles facing the plurality of unit regions.

The combination of the droplet volume adjusting operation and the printing interval adjusting operation may be selected, and the generating of the control data may further include setting a ratio of an amount of droplets to be discharged onto the plurality of unit regions of the second region to a standard discharge amount; and setting an interval ratio of an interval of discharging droplets onto the second region to an interval of discharging droplets onto the first region.

The generating of the control data may further include forming bitmap data according to the interval ratio, the bitmap data indicating unit regions onto which droplets are to be discharged as value of 1, and indicating unit regions onto which droplets are not to be discharged as value of 0, from among the plurality of unit regions of the second region.

The generating of the control data may include generating control data for printing the second region by using data in a matrix form obtained by multiplying the bitmap data generated for each of the plurality of unit regions of the second region, the ratio of an amount of droplets to be discharged onto each of the plurality of unit regions of the second region to a standard discharge amount, and the standard driving voltages for the plurality of nozzles facing the plurality of unit regions.

Embodiments are also directed to a method of manufacturing a display apparatus, the method including providing a substrate, the substrate having a peripheral region at edges thereof and having a central region bounded by the peripheral region, and forming a material layer on the substrate by printing a material thereon, printing the material including printing the material in the central region at a first print density, the first print density being constant in the central region, and printing the material in the peripheral region at a second print density, the second print density being less than the first print density.

Printing the material in the peripheral region may include printing the material at a plurality of print densities that respectively decrease in print density closer to the edges.

Printing the material in the peripheral and central regions may be by ink jet printing, and the peripheral and central regions may be printed using a same ink jet print head.

Printing the material in the peripheral and central regions may performed at a same deposition frequency per unit area in the peripheral and central regions, and the volume of the material deposited in the peripheral region may be reduced per unit area relative to the central region.

Printing the material in the peripheral region may be performed at a lower deposition frequency than printing the material in the central region, and the material printed in the peripheral region may be the same volume per deposition as in the central region, the material printed in the peripheral region may be a reduced volume per deposition relative to the central region, or a combination thereof.

BRIEF DESCRIPTION OF THE DRAWINGS

Features will become apparent to those of skill in the art by describing in detail example embodiments with reference to the attached drawings in which:

FIGS. 14 and 15 respectively illustrate an example of adjustment data showing a ratio of an amount of droplets to be discharged onto the unit regions of the second region to a standard discharge amount and an example of bitmap data showing whether to eject droplets to the unit regions of the second region, when a combination method is selected as a print density varying method in the flowchart of FIG. 6;

DETAILED DESCRIPTION

Figure 1:
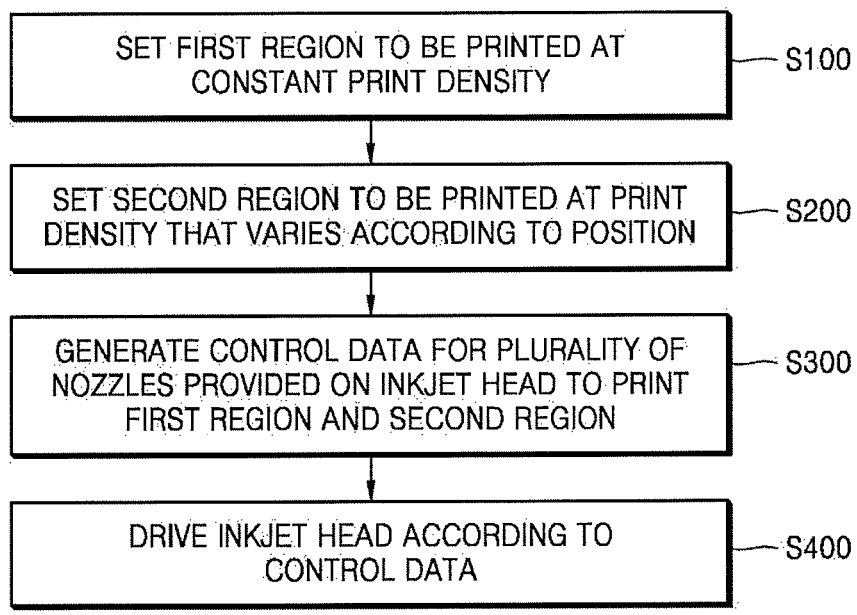
FIG. 1 illustrates a flowchart of an inkjet printing method according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that although the terms "first", "second", etc. may be used herein to describe various elements, these elements should not be limited by these terms. These elements are only used to distinguish one element from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements may be exaggerated for convenience of explanation. For example, since sizes and thicknesses of elements in the drawings are arbitrarily illustrated for convenience of explanation, the following embodiments are not limited thereto.

As used herein, the term "and/or" includes any and all combinations of one or more of the associated listed items. Expressions such as "at least one of" when preceding a list of elements, modify the entire list of elements and do not modify the individual elements of the list.

FIG. 1 is a flowchart of an inkjet printing method according to an embodiment.

Embodiments may provide a uniform film thickness distribution and a clear boundary around an edge of a target region to be printed. The inkjet printing method according to the present example embodiment includes setting a region with a constant print density and a region with a variable print density and driving an inkjet head to achieve a set print density, which may provide a uniform film thickness distribution and a clear boundary around an edge of a target region to be printed.

The term 'print density' refers to an amount of ejected droplets per unit area of the target region during inkjet printing and is determined by a volume of each droplet and an interval between the droplets. The print density may be different from a film thickness distribution finally obtained by the inkjet printing.

Referring to FIG. 1, the inkjet printing method includes operation S100 in which a first region to be printed at a constant print density is set and operation S200 in which a second region to be printed at a print density that varies according to a position is set, with respect to a target region to be printed.

The second region is closer than the first region to an edge of the target region. The target region may be a region of a display substrate.

Detailed data such as a position and an area of the second region may be determined when the second region is set. To this end, a thickness of a thin film to be formed on the first region may be considered. A print density of the second region is set to be less than a print density of the first region. The print density of the second region may vary according to a position. For example, the print density of the second region may decrease toward the edge. Operation S100, in which the first region is set, and operation S200, in which the second region is set, may be performed in any order. Thus, any of operations S100 and S200 may be first performed or operations S100 and S200 may be simultaneously performed.

Once the first region and the second region are set, the inkjet printing method may proceed to operation S300. In operation S300, control data for a plurality of nozzles provided on an inkjet head is generated to print the first region and the second region. When the target region is divided into a plurality of unit regions facing the plurality of nozzles of the inkjet head, the control data may be data for controlling an interval between droplets to be discharged onto each unit region or a volume of each of the droplets. For example, as the inkjet head moves relative to the target region, control information about, for example, a driving voltage or whether to eject droplets, may be provided for each of the plurality of unit regions facing the plurality of nozzles. The control data may be formed to have a matrix form.

An order in which operation S100 in which the first region is set, operation S200 in which the second region is set, and operation S300 in which the control data is generated are performed is not limited to that in the flowchart. For example, the first region may be set and control data for the first region may be generated, and then the second region may be set and control data for the second region may be generated, or vice versa.

Once the control data is generated, the inkjet printing method may proceed to operation S400. In operation S400, the inkjet head is driven according to the control data. When the inkjet head is driven, the control data in the matrix form having a direction in which the inkjet head travels as a column and a direction in which the plurality of nozzles are arranged as a row is used. The control data includes information related to droplets to be discharged onto each of the plurality of unit regions of the target region, and information about each unit region of the target region facing each of the nozzles is provided by stage encoder data about a relative movement of the inkjet head. The inkjet head ejects droplets to the target region according to the control data that is linked to the stage encoder data.

Figure 2:
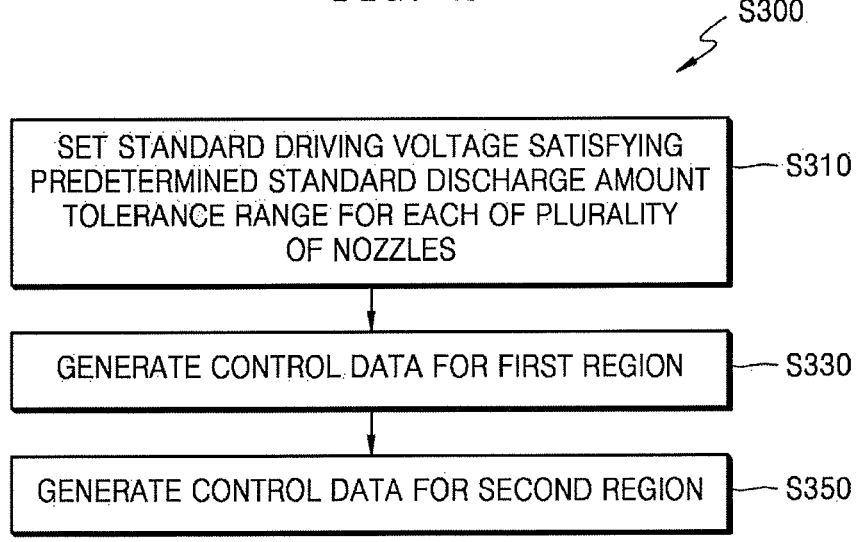
FIG. 2 illustrates a flowchart for explaining an operation of generating control data in the inkjet printing method of FIG. 1.

FIG. 2 is a flowchart for explaining operation S300 in which control data is generated in the inkjet printing method of FIG. 1.

Operation S300 in which control data is generated may include operation S310 in which a standard driving voltage satisfying a predetermined standard discharge amount tolerance range is set for each of the plurality of nozzles, operation S330 in which control data for the first region is generated, and operation S350 in which control data for the second region is generated.

The plurality of nozzles provided on the inkjet head may be respectively turned on/off by actuators, for example, piezoelectric devices, and may eject droplets with the same volume at different driving voltages, due to manufacturing tolerance. In operation S310 in which the standard driving voltage is set, the standard driving voltage at which a standard discharge amount is provided is determined for each of the nozzles. The set standard driving voltage is used as a reference value for changing a volume of each droplet when control data for the first region and control data for the second region are generated.

After the standard driving voltage is set, any of operation S330 in which control data of the first region is generated and operation S350 in which control data of the second region is generated may be first performed.

Figure 3:
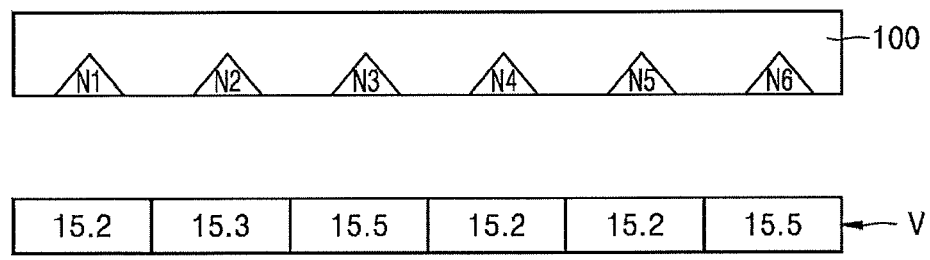
FIG. 3 illustrates an example of standard driving voltage data set for each of a plurality of nozzles provided on an inkjet head.

FIG. 3 illustrates an example of standard driving voltage data V set for each of a plurality of nozzles N1, N2, N3, N4, N5, and N6 provided on an inkjet head 100.

The standard driving voltage data V may be a set of driving voltages at which each of the plurality nozzles N1, N2, N3, N4, N5, and N6 of the inkjet head 100 ejects a predetermined standard discharge amount. As shown in FIG.

3, the standard driving voltage data V may be provided to have a matrix form having a direction in which the plurality of nozzles N1, N2, N3, N4, N5, and N6 are arranged as one row. Each voltage included in the standard driving voltage data V may not be the very voltage at which each nozzle ejects a standard discharge amount, but may be a value that is included in a standard discharge amount tolerance range determined according to a process condition.

Figure 4:
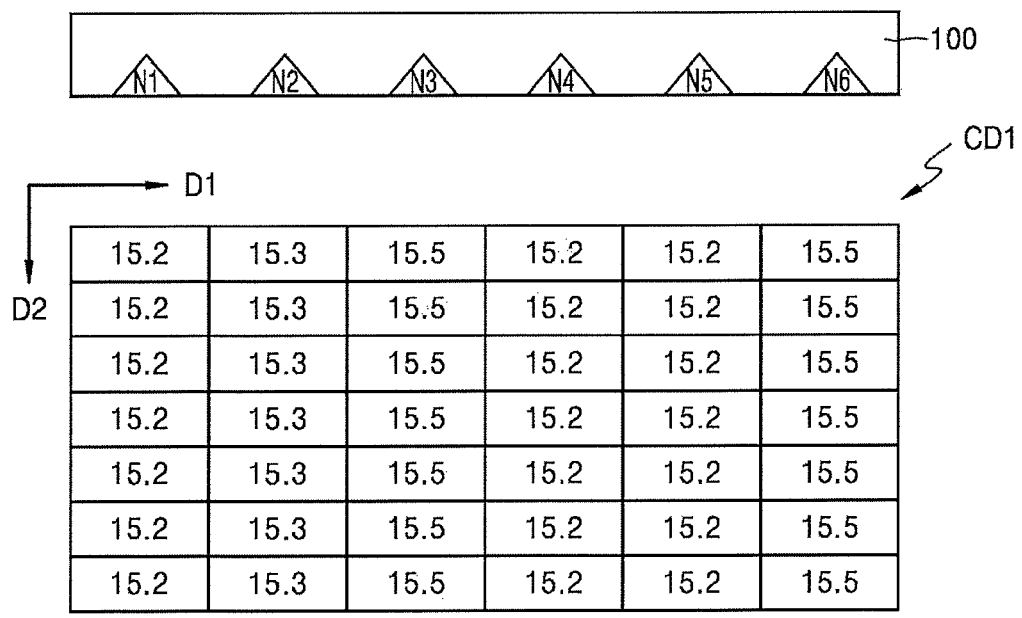
FIG. 4 illustrates a view illustrating an example where control data for a first region is generated from the standard driving voltage data of FIG. 3.
Figure 5:
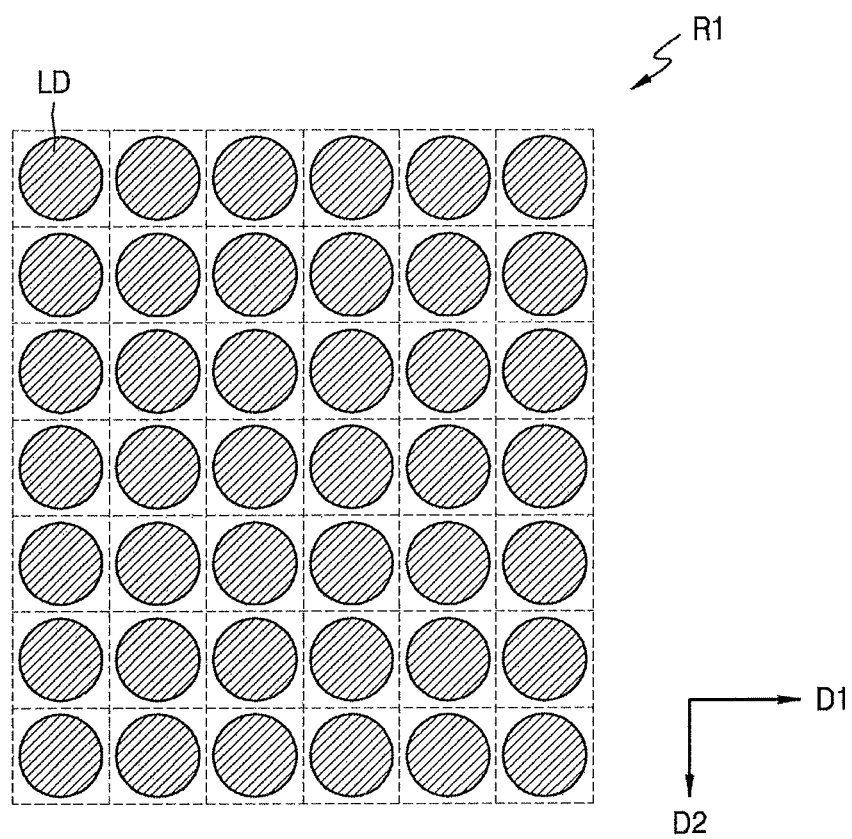
FIG. 5 illustrates a view illustrating an example where an inkjet head is driven to eject droplets to the first region according to the control data of FIG. 4.

FIG. 4 is a view illustrating an example where control data CD1 for the first region is generated from the standard driving voltage data V of FIG. 3. FIG. 5 is a view illustrating an example where the inkjet head 100 is driven according to the control data CD1 of FIG. 4 to eject droplets LD to the first region.

In FIG. 4, D1 denotes a first direction in which the plurality of nozzles N1, N2, N3, N4, N5, and N6 are arranged and D2 denotes a second direction in which the inkjet head 100 relatively moves. The control data CD1 may be formed to have a matrix form including control information about unit regions of the first region facing the plurality of nozzles N1, N2, N3, N4, N5, and N6 that move in the second direction D2. In the present example embodiment, the first region has a constant print density. Thus, the control data CD1 for the first region may have a matrix form in which a row of the standard driving voltage data V set in FIG. 3 is repeatedly disposed in the second direction D2.

Referring to FIG. 5, the inkjet head 100 ejects the droplets LD to a first region R1 of the target region according to the generated control data CD1. A driving voltage determined as a standard driving voltage is constantly applied to each of the nozzles N1, N2, N3, N4, N5, and N6, and the inkjet head 100 ejects the droplets LD while moving in the second direction D2. An interval in the second direction D2 between the droplets LD is determined by a speed at which the inkjet head 100 moves relative to the target area and an ejection frequency of each of the nozzles N1, N2, N3, N4, N5, and N6. The control data CD1 is data for ejecting the droplets LD so that an interval between the droplets LD and a volume of each of the droplets LD are constant, and each of the nozzles N1, N2, N3, N4, N5, and N6 ejects the droplets LD at a constant ejection frequency and the determined driving voltage. Accordingly, as shown in FIG. 5, the droplets LD with constant sizes and constant intervals are discharged onto the first region R1.

Figure 6:
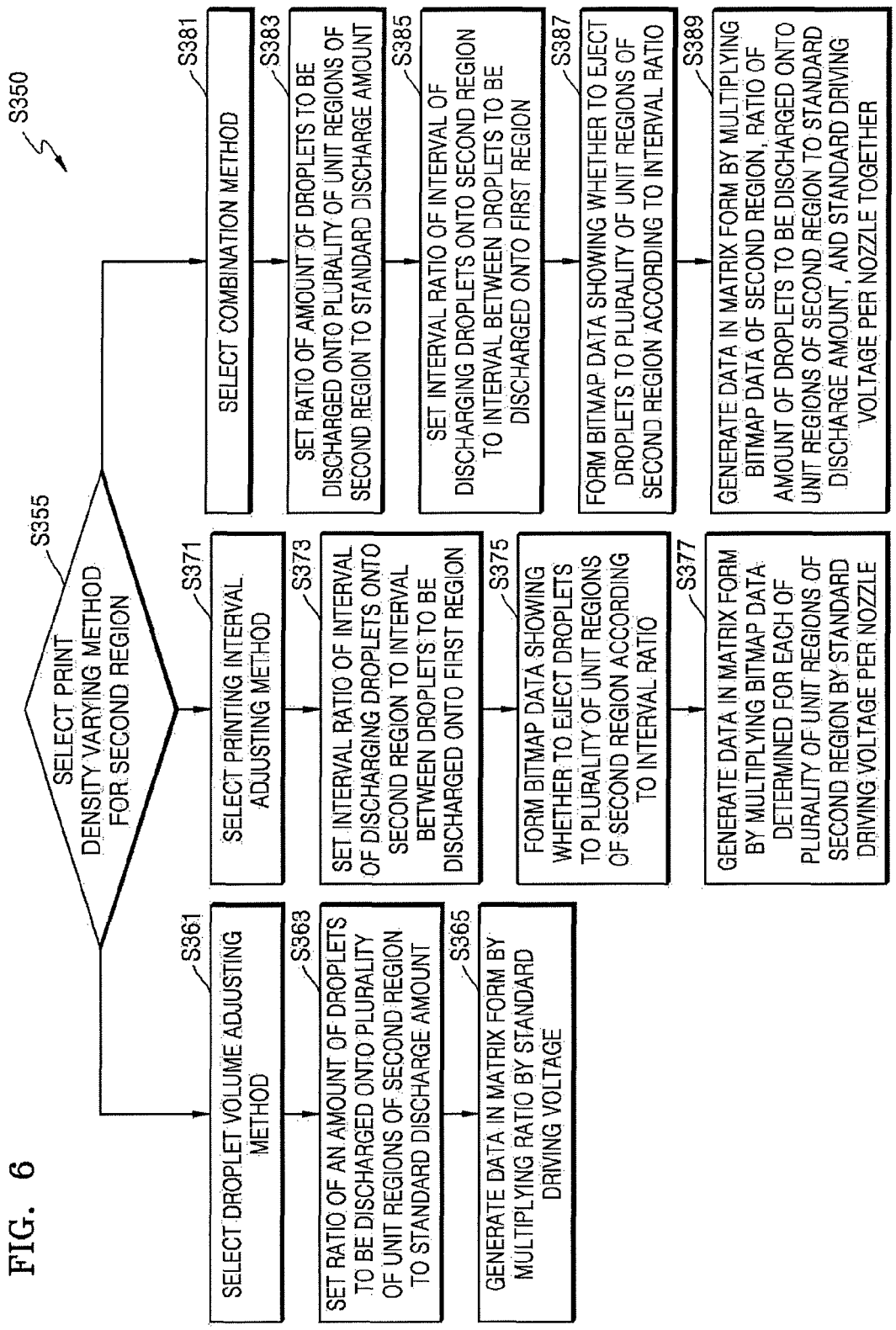
FIG. 6 illustrates a flowchart for explaining an operation of generating control data for a second region.

FIG. 6 is a detailed flowchart for explaining operation S350 in which control data for the second region is generated.

In operation S355, in order to generate control data for the second region, a print density varying method for the second region is first selected. In operation S361, S371, or S381, a droplet volume adjusting method, a printing interval adjusting method, or a combination method may be selected as the print density varying method.

At the same time as, before, or after the print density varying method is selected, a print density profile to be formed on the second region may be set.

Figures 7, 8:
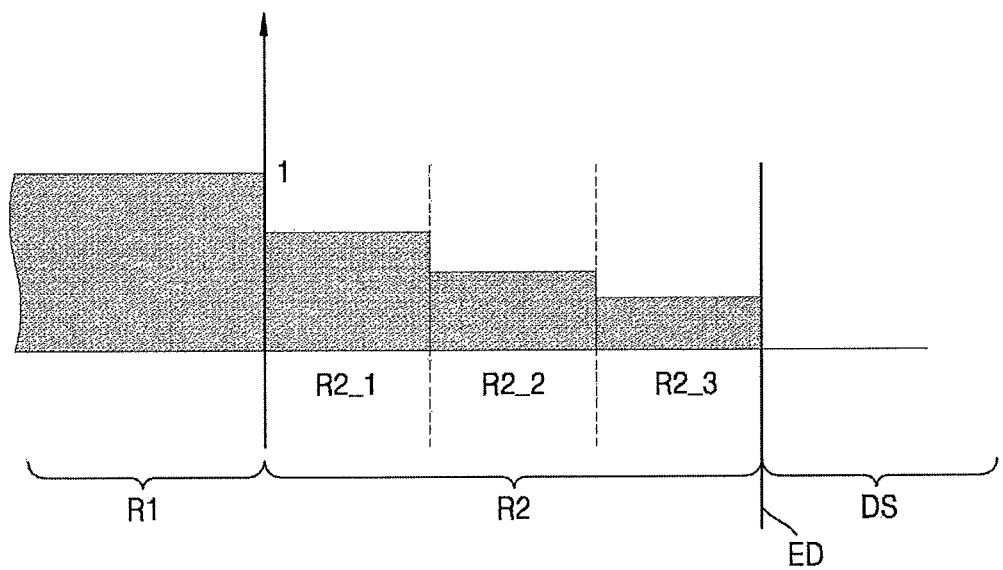
FIG. 7 illustrates a graph showing an example of a variable print density profile to be used to generate the control data for the second region in the flowchart of FIG. 6.
FIG. 8 illustrates an example of adjustment data showing a ratio of an amount of droplets to be discharged onto unit regions of the second region to a standard discharge amount when a droplet volume adjusting method is selected as a print density varying method in the flowchart of FIG. 6.

Referring to FIG. 7, a second region R2 may be divided into a 2_1 region R2_1, a 2_2 region R2_2, and a 2_3 region R2_3, and a print density of each region may be set. In FIG. 7, the print density of the first region R1 is 1 as an example reference print density.

DS denotes a dead space, that is, a space where a thin film will not formed by inkjet printing, and ED denotes an edge of the target region.

Control data for the second region is generated according to the selected print density varying method and the print density profile to be achieved.

Operation S361, in which a droplet volume adjusting method is selected in the flowchart of FIG. 6, will now be explained with reference to FIGS. 8 through 10.

FIG. 8 illustrates an example of adjustment data VR1 showing a ratio of an amount of droplets to be discharged by six nozzles onto unit regions of the second region to a standard discharge amount, when a droplet volume adjusting method is selected as a print density varying method in the flowchart of FIG. 6. FIG. 9 is a view illustrating an example where control data CD2_1 for the second region is generated from the adjustment data VR1. FIG. 10 is a view illustrating an example where the inkjet head 100 is driven according to the control data CD2_1 of FIG. 9 to eject the droplets LD to the second region R2.

When a droplet volume adjusting method is selected in operation S361, then, in operation S363, a ratio of an amount of droplets to be discharged onto a plurality of unit regions of the second region to a standard discharge amount is set.

The term 'standard discharge amount' refers to an amount of droplets ejected at the standard driving voltage set in FIG. 3. The ratio may be set for each of the plurality of unit regions so that the print density profile of FIG. 7 is achieved. As shown in FIG. 8, the adjustment data VR1 in a matrix form, in which a row direction and a column direction are respectively defined as the first direction D1 and the second direction D2, may be set. The first direction D1 and the second direction D2 respectively refer to a direction in which the plurality of nozzles of the inkjet head are arranged and a direction in which the inkjet head moves relative to the target region, as described above.

Next, in operation S365, control data in a matrix form is formed by multiplying the ratio set for each unit region by the standard driving voltage per nozzle.

Figure 9:
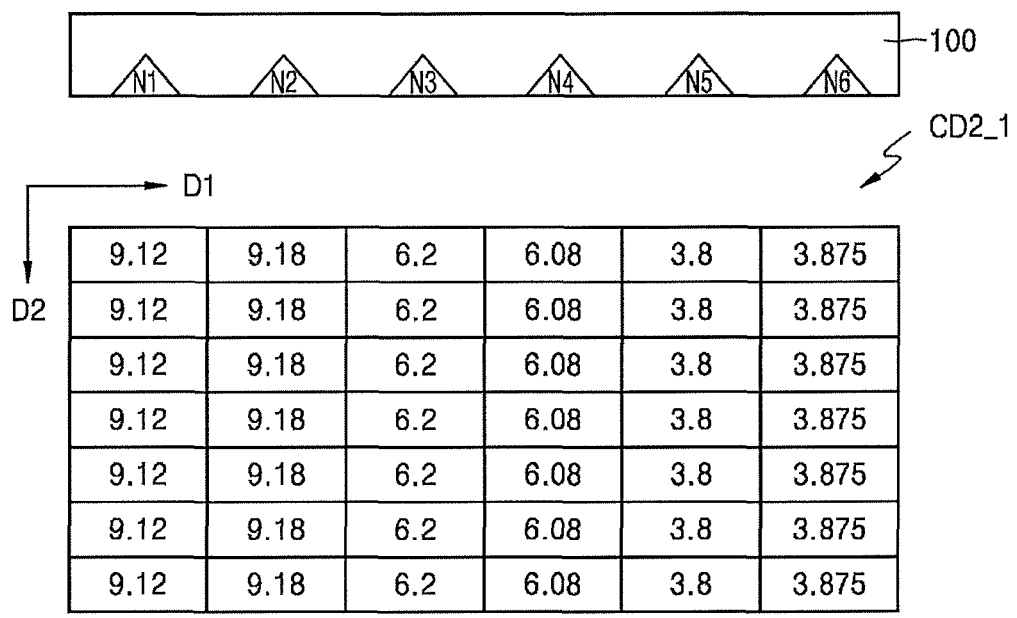
FIG. 9 illustrates a view illustrating an example where control data for the second region is generated from the adjustment data of FIG. 8 and the standard driving voltage data set in FIG. 3.
Figure 10:
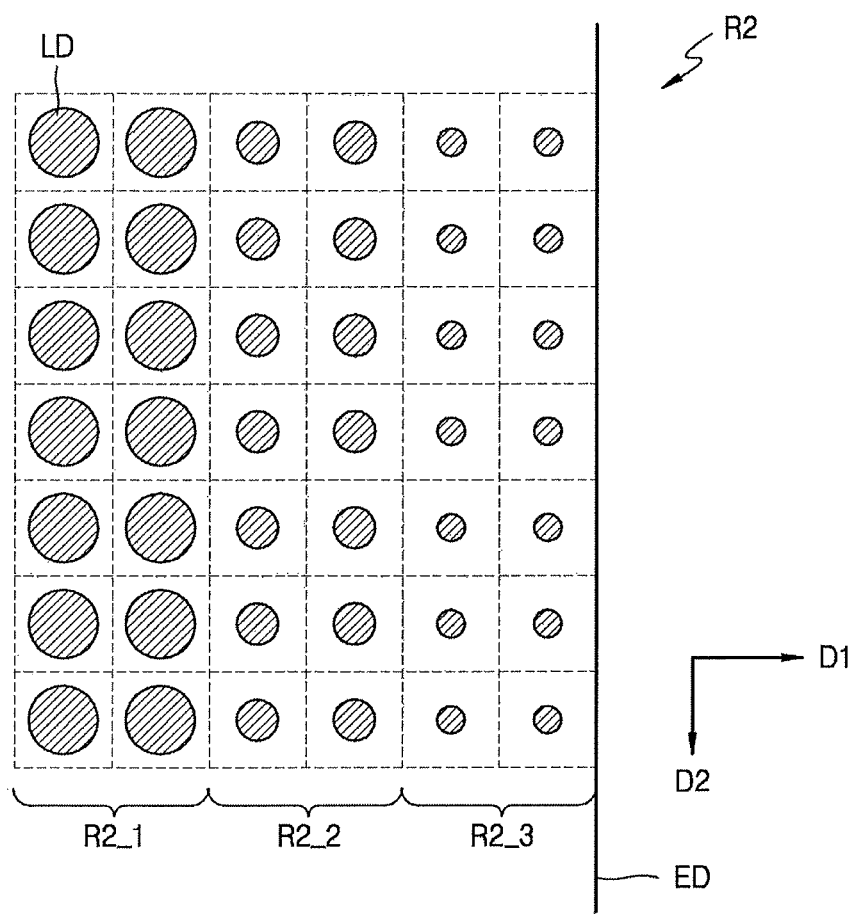
FIG. 10 illustrates a view illustrating an example where the inkjet head is driven according to the control data of FIG. 9 to eject droplets to the second region.

Referring to FIG. 9, the control data CD2_1 has a matrix form in which a row direction and a column direction are respectively set as the first direction D1 and the second direction D2, and a value at each position (i,j) (i.e., an $i^{th}$ row and a $j^{th}$ column) is determined as follows.

$$\{CD2\_1\}_{ij} = \{VR1\}_{ij} * \{V\}_j$$

The inkjet head 100 ejects the droplets LD to the first region R2 of the target region according to the control data CD1. When the inkjet head 100, which moves in the second direction D2, faces the plurality of unit regions, a driving voltage included in the control data CD2_1 set for each region is applied to each of the nozzles N1, N2, N3, N4, N5, and N6, and the droplets LD are ejected at the driving voltage. In the present example embodiment, while the inkjet head 100 moves in the second direction D2, each of the plurality of nozzles N1, N2, N3, N4, N5, and N6 ejects the droplets LD at a constant ejection frequency. Accordingly, as shown in FIG. 10, the droplets LD are discharged onto the second region R2 so that an interval in the second direction D2 between the droplets LD is constant, and volumes of the droplets LD decrease toward the edge ED. The expression 'interval between the droplets LD' refers to a distance between centers of adjacent droplets LD. Volumes of the droplets LD gradually decrease in an order of the 2_1 region R2_1, the 2_2 region R2_2, and the 2_3 region R2_3.

Operation S371, in which a printing interval adjusting method is selected in the flowchart of FIG. 6, will now be explained with reference to FIGS. 11 through 13.

Figure 11:
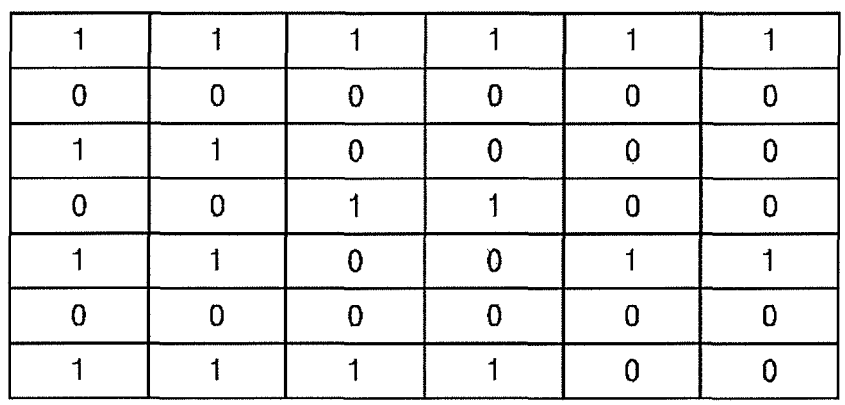
FIG. 11 illustrates an example of bitmap data showing whether to eject droplets to the unit regions of the second region when a printing interval adjusting method is selected as the print density varying method in the flowchart of FIG. 6.

FIG. 11 illustrates an example of bitmap data BM1 showing whether to eject droplets from six nozzles to the unit regions of the second region when a printing interval adjusting method is used as a print density varying method in the flowchart of FIG. 6. FIG. 12 is a view illustrating an example where control data CD2_2 for the second region is generated from the standard driving voltage data V set in FIG. 3 and the bitmap data BM1 of FIG. 11. FIG. 13 is a view illustrating an example wherein the inkjet head 100 is driven according to the control data CD2_2 of FIG. 12 to eject the droplets LD to the second region R2.

When a printing interval adjusting method is selected as a print density varying method in operation S371, then, in operation S373, an interval ratio of an interval of discharging droplets onto the second region to an interval between droplets to be discharged onto the first region is set. Thus, when an interval between droplets in the first region with a constant print density is 1, an interval between droplets in the second region may vary according to a position. The interval may be determined, for example, so that the print density profile set in FIG. 7 is achieved.

Next, in operation S375, bitmap data showing whether to eject droplets to the plurality of unit regions of the second region is formed according to the set interval ratio. A value of a region to which droplets are to be ejected may be 1 and a value of a region to which droplets are not to be ejected may be 0. The bitmap data BM1 in a matrix form as shown in FIG. 11 is formed.

Next, in operation S377, the control data CD2_2 in a matrix form is generated by multiplying the bitmap data determined for each of the unit regions of the second region by the standard driving voltage per nozzle.

Figure 12:
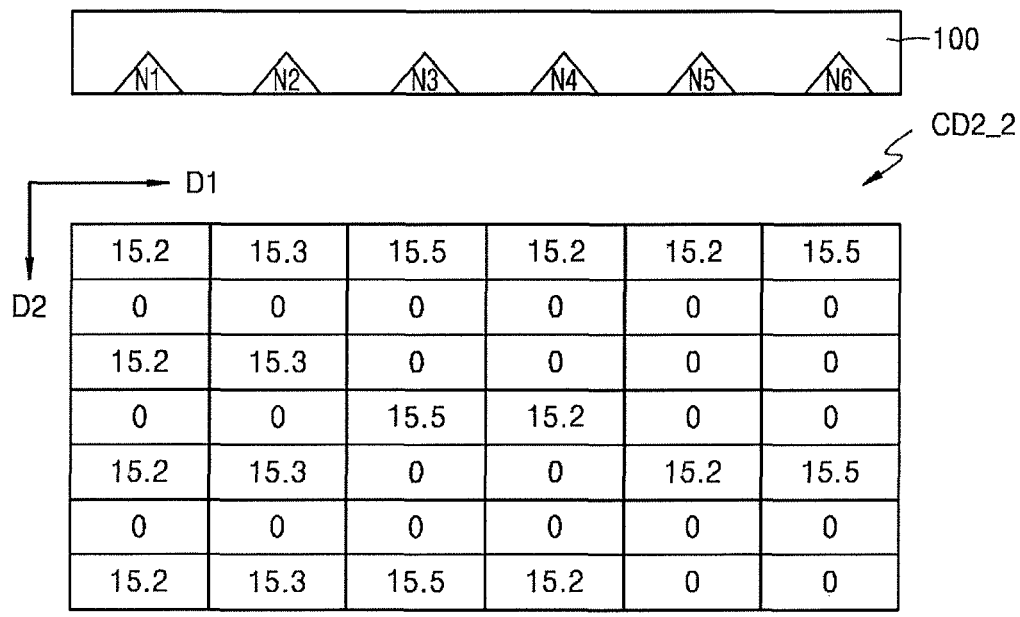
FIG. 12 illustrates a view illustrating an example where control data for the second region is generated from the standard driving voltage data set in FIG. 3 and the bitmap data of FIG. 11.

Referring to FIG. 12, the control data CD2_2 has a matrix form in which a row direction and a column direction are respectively set as the first direction D1 and the second direction D2, and a value at each position (i,j) (i.e., an $i^{th}$ row and a $j^{th}$ column) is determined as follows.

$$\{CD2\_2\}_{ij} = \{BM1\}_{ij} * \{V\}_j$$

The inkjet head 100 ejects the droplets LD to the second region R2 of the target region according to the control data CD2_2. When the inkjet head 100, which moves in the second direction D2, faces the plurality of unit regions, a driving voltage included in the control data CD2_2 set for each region is applied to each of the nozzles N1, N2, N3, N4, N5, and N6, and the droplets LD are ejected at the driving voltage. While the inkjet head 100 moves in the second direction D2, the plurality of nozzles N1, N2, N3, N4, N5, and N6 eject the droplets LD at different ejection frequencies. For example, when an ejection frequency during printing according to the control data CD1 of FIG. 4 or CD2_1 of FIG. 9 $f_0$, the nozzles N1 and N2 eject the droplets LD at an ejection frequency of $f_0/2$, the nozzles N3 and N4 eject the droplets LD at an ejection frequency of $f_0/3$, and the nozzles N5 and N6 eject the droplets LD at an ejection frequency of $f_0/4$.

Figure 13:
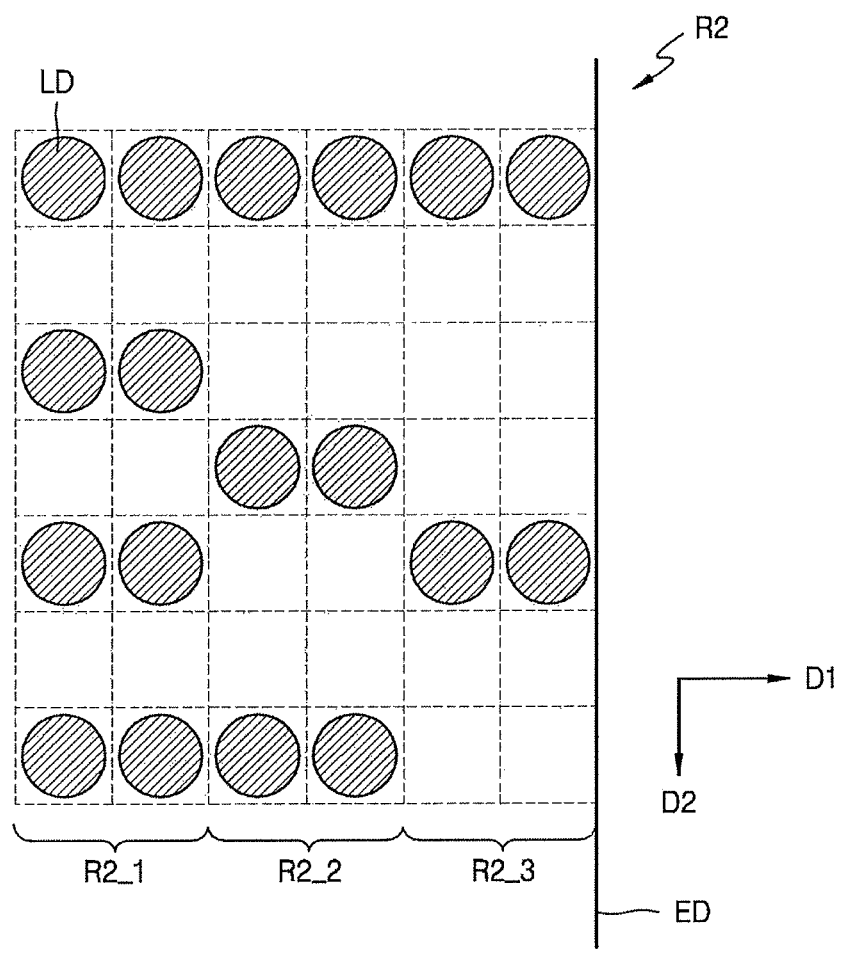
FIG. 13 illustrates a view illustrating an example where the inkjet head is driven according to the control data of FIG. 12 to eject droplets to the second region.

Accordingly, as shown in FIG. 13, the droplets LD are discharged onto the second region R2 so that volumes of the droplets LD are constant and intervals between the droplets LD increase toward the edge ED. Thus, as shown in FIG. 13, intervals between the droplets LD gradually increase in an order of the 2_1 region R2_1, the 2_2 region R2_2, and the 2_3 region R2_3.

Operation S381, in which a combination method is selected in the flowchart of FIG. 6, will now be explained with reference to FIGS. 14 through 16.

FIGS. 14 and 15 respectively illustrate an example of adjustment data VR2 showing a ratio of an amount of droplets to be discharged from six nozzles onto the unit regions of the second region to a standard discharge amount and an example of bitmap data BM2 showing whether to eject droplets to the unit regions of the second region, when a combination method is selected as a print density varying method in the flowchart of FIG. 6. FIG. 16 is a view illustrating an example where control data CD2_3 for the second region is generated from the standard driving voltage data V set in FIG. 3, the adjustment data VR2 of FIG. 14, and the bitmap data BM2 of FIG. 15. FIG. 17 is a view illustrating an example where the inkjet head 100 is driven according to the control data CD2_3 of FIG. 16 to eject the droplets LD to the second region R2.

When a combination method is selected as a print density varying method in operation S381, then, in operation S383, a ratio of an amount of droplets to be discharged onto the unit regions of the second region to a standard discharge amount is set.

The expression 'standard discharge amount' refers to an amount of droplets ejected at the standard driving voltage V set in FIG. 3. Ratio data with respect to the standard discharge amount is set for each of the plurality of unit regions. As shown in FIG. 14, the adjustment data VR2 in a matrix form in which a row direction and a column direction are respectively set as the first direction D1 and the second direction D2 is set.

Also, in operation S385, an interval ratio of an interval of discharging droplets onto the second region to an interval between droplets to be discharged onto the first region is set. When an interval between droplets in the first region with a constant print density is 1, an interval between droplets in the second region may vary according to a position.

Although operation S383 is performed and then operation S385 is performed, the present example embodiment is not limited thereto, and operation S385 may be first performed and then operation S383 may be performed or operations S363 and S385 may be simultaneously performed.

Ratio data with respect to the standard discharge amount and interval data of droplets to be discharged onto the second region may be determined, for example, so that the print density profile set in FIG. 7 is achieved.

Next, in operation S387, bitmap data showing whether to eject droplets to the plurality of unit regions of the second region is formed according to the set interval ratio. A value of a region to which droplets are to be ejected may be 1 and a value of a region to which droplets are not to be ejected may be 0. The bitmap data BM2 in a matrix form as shown in FIG. 15 is formed.

Next, in operation S389, the control data CD2_3 in a matrix form is generated by multiplying the bitmap data determined for each of the unit regions of the second region, the ratio of the droplets to be discharged onto the unit regions to the standard discharge amount, and the standard driving voltage per nozzle together.

Figure 16:
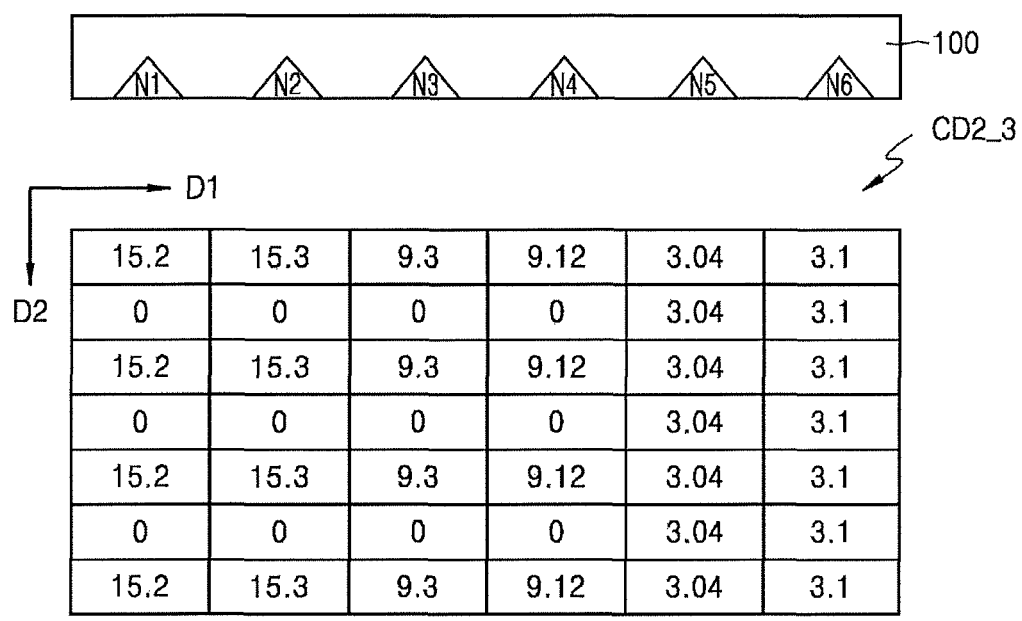
FIG. 16 illustrates a view illustrating an example where control data for the second region is generated from the standard driving voltage data set in FIG. 3, the adjustment data of FIG. 14, and the bitmap data of FIG. 15.
Figure 17:
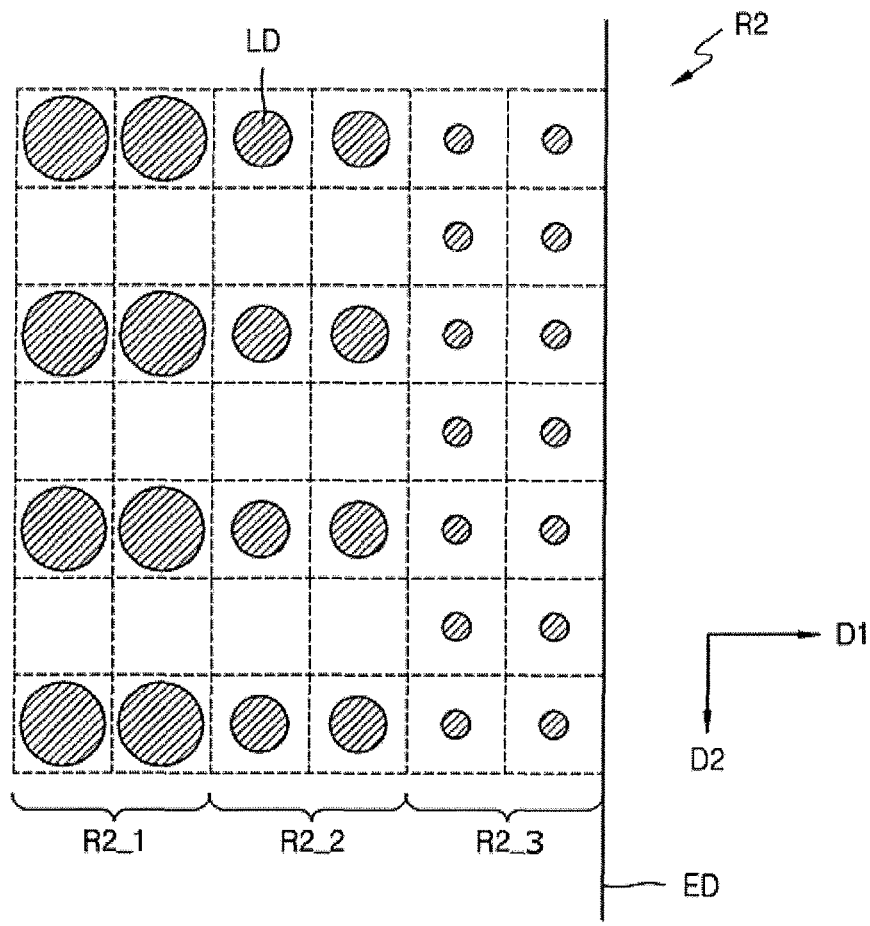
FIG. 17 illustrates a view illustrating an example where the inkjet head is driven according to the control data of FIG. 16 to eject droplets to the second region.

Referring to FIG. 16, the control data CD2_3 has a matrix form in which a row direction and a column direction are respectively set as the first direction D1 and the second direction D2, and a value at each position (i,j) (i.e., an $i^{th}$ row and a $j^{th}$ column) is determined as follows.

$$\{CD2\_3\}_{ij} = \{VR2\}_{ij} * \{BM2\}_{ij} * \{V\}_j$$

The inkjet head 100 ejects the droplets LD to the second region R2 of the target region according to the control data CD2_3. When the inkjet head 100, which moves in the second direction D2, faces the plurality of unit regions, a driving voltage included in the control data CD2_3 set for each region is applied to each of the nozzles N1, N2, N3, N4, N5, and N6, and the droplets LD are ejected at the driving voltage. When the control data CD2_3 of the unit regions facing the nozzles N1, N2, N3, N4, N5, and N6 is 0, it means a region to which the droplets LD are not ejected. Ejection frequencies of the nozzles N1, N2, N3, N4, N5, and N6 may be adjusted accordingly. The plurality of nozzles N1, N2, N3, N4, N5, and N6 may eject the droplets LD at different ejection frequencies while the inkjet head 100 moves in the second direction D2. When an ejection frequency during printing according to the control data CD1 of FIG. 4 or CD2_1 of FIG. 9 is $f_0$, the nozzles N1, N2, N3, and N4 may eject the droplets LD at an ejection frequency of $f_0/2$ and the nozzles N5 and N6 may eject the droplets LD at an ejection frequency of $f_0$.

Accordingly, as shown in FIG. 17, the droplets LD are discharged onto the second region R2 so that volumes of the droplets LD and intervals in direction D2 between the droplets LD in the 2_1 region R2_1, the 2_2 region R2_2, and the 2_3 region R2_3 are different from one another. Printing densities decrease in an order of the 2_1 region R2_1, the 2_2 region R2_2, and the 2_3 region R2_3, that is, toward the edge ED. For example, the droplets LD with volumes that are the same as those of the droplets LD discharged onto the first region R1 of FIG. 5 and intervals that are twice greater than those of the droplets LD discharged onto the first region R1 of FIG. 5 are discharged onto the in the 2_1 region R2_1 to have a print density less than that in the first region R1. The droplets LD with volumes that are less than those of the droplets LD discharged onto the 2_1 region R2_1 and intervals that are the same as those of the droplets LD discharged onto the 2_1 region R2_1 are discharged onto the 2_2 region R2_2 to have a print density less than that in the 2_1 region R2_1. The droplets LD with volumes that are less than those of the droplets LD discharged onto the 2_2 region R2_2 and intervals that are less than those of the droplets LED discharged onto the 2_2 region R2_2 are discharged onto the 2_3 region R2_3 to have a print density less than that in the 2_2 region R2_2.

Various methods of varying a print density around an edge of a target region have been exemplarily explained, and specific values such as the number of regions, a driving voltage, a ratio, and an interval may be changed in various ways.

Figure 18:
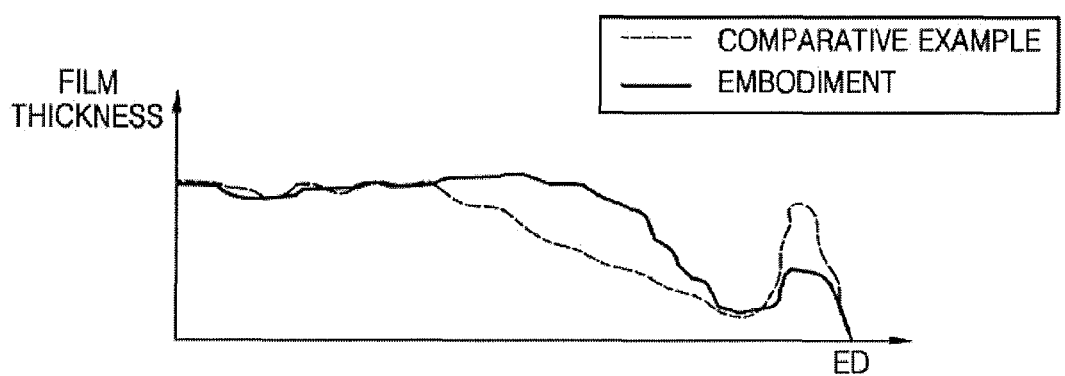
FIG. 18 illustrates a graph showing a film thickness distribution around an edge of a printing region formed by using an inkjet printing method according to an embodiment and a comparative example.

FIG. 18 is a graph showing a film thickness distribution around an edge of a target region formed by using an inkjet printing method according to an embodiment and a comparative example.

The comparative example shows a film thickness when printed by inkjet printing without using a variable print density.

During inkjet printing, in general, a film thickness is gradually reduced toward the edge ED of the target region by the time a thickness-increasing region, called a coffee stain, close to the edge ED appears due to spreading of a solution. In the example embodiment shown in FIG. 18, a predetermined region close to the edge ED is set as a print density varying region and droplets with volumes and intervals controlled by the above-described inkjet printing method are ejected. Thus, a coffee stain effect is reduced. When compared with the comparative example, in the example embodiment shown in FIG. 18, a width of a film thickness-increasing region close to the edge ED is reduced and a width of region in which film thickness is reduced toward the edge ED is reduced.

The above-described inkjet printing method may improve film thickness uniformity around the edge of the target region and may be used in various applications. For example, the inkjet printing method may be used to form, for example, an alignment film of a liquid crystal display apparatus or an encapsulation film of an organic light-emitting display apparatus.

Figure 19:
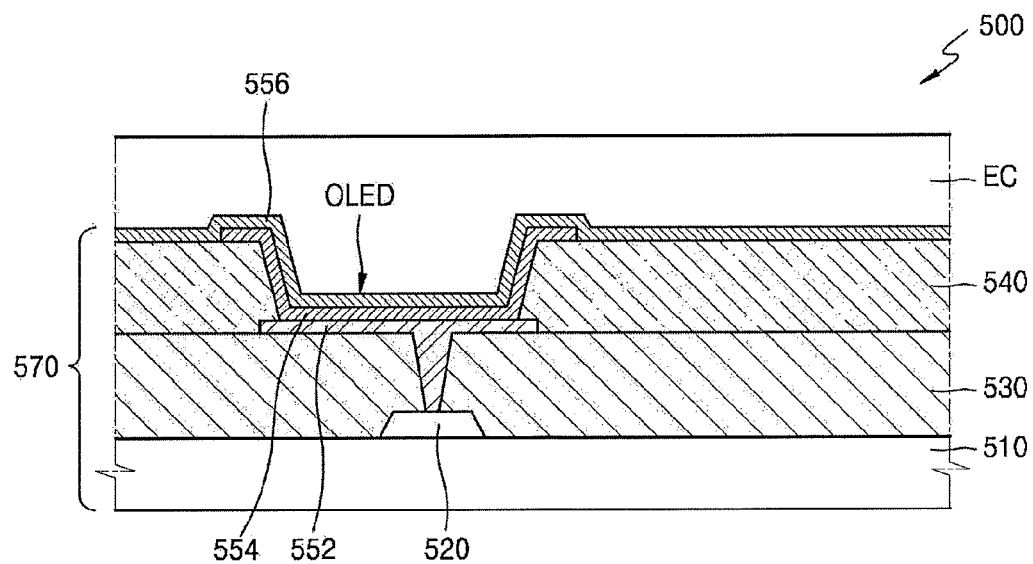
FIG. 19 illustrates a cross-sectional view of a display apparatus to which an inkjet printing method is applied according to an embodiment.

FIG. 19 is a cross-sectional view of a display apparatus 500 to which an inkjet printing method is applied according to an embodiment.

The display apparatus 500 that is an organic light-emitting display apparatus includes a display substrate 570 in which organic light-emitting devices OLED are arrayed and an encapsulation film EC configured to encapsulate the display substrate 570.

The display substrate 570 includes a substrate 510, a pixel circuit 520 formed on the substrate 510, an insulating film 530 that covers the pixel circuit 520, the organic light-emitting devices OLED, and a pixel-defining film 540. The pixel circuit 520 may include a thin-film transistor and a capacitor. Each of the organic light-emitting devices OLED includes a first electrode 552 electrically connected to the pixel circuit 520, an intermediate layer 554, and a second electrode 556.

The intermediate layer 554 may include an organic emission layer, and may further include a hole transport layer, a hole injection layer, an electron transport layer, and an electron injection layer.

Each of the substrate 510, the first electrode 552, and the second electrode 556 may be formed of a transparent, semi-transparent, or reflective material according to a display direction of the display apparatus 500, for example, whether the display apparatus 500 is a top emission display apparatus or a bottom emission display apparatus.

The encapsulation film EC may be provided to protect the organic light-emitting devices OLED and extend a lifetime of the display apparatus 500. Although the encapsulation film EC has a single-layer structure in FIG. 19, the encapsulation film EC may be formed to have a multi-layer structure including a plurality of organic films and inorganic films.

The above-described inkjet printing method may be used to manufacture the display apparatus 500. For example, after the display substrate 570 including the organic light-emitting devices OLED is formed, the display substrate 570 may be encapsulated with the encapsulation film EC using the method. The encapsulation film EC may be manufactured according to a method suitable for an organic film or an inorganic film that is a material of the encapsulation film EC, and the above-described inkjet printing method may be applied to at least one layer of the encapsulation film EC.

Figure 20:
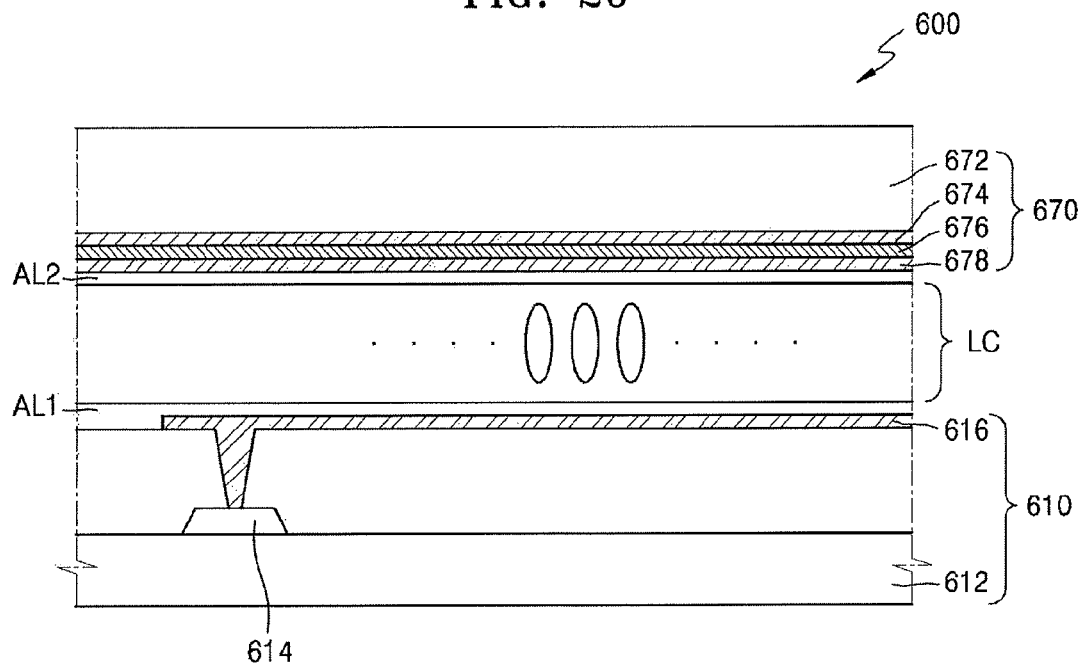
FIG. 20 illustrates a cross-sectional view of a display apparatus to which an inkjet printing method is applied according to another embodiment.

FIG. 20 is a cross-sectional view of a display apparatus 600 to which an inkjet printing method is applied according to another embodiment.

The display apparatus 600 may include a first substrate 610 including a pixel circuit 614 for controlling a display region and a pixel electrode 616, a second substrate 670 facing the first substrate 610 to be spaced apart from the first substrate 610, and a liquid crystal layer LC disposed between the first substrate 610 and the second substrate 670. The pixel circuit 520 may include a thin film transistor and a capacitor. The pixel electrode 616 may have various patterns to control the liquid crystal layer LC.

The above-described inkjet printing method may be used to manufacture the display apparatus 600. For example, the first substrate 610 including the pixel circuit 614 and the pixel electrode 616 provided on a substrate 612 may be formed, and a first alignment film AL1 may be formed on the first substrate 610 according to the above-described inkjet printing method.

Also, the second substrate 670 including a color filter 674, a planarization layer 676, and a common electrode 678 provided on a substrate 672 may be formed, and a second alignment film AL2 may be formed on the second substrate 670 by using the above-described inkjet printing method. Although the color filter 674, the planarization layer 676, and the common electrode 678 are provided on the second substrate 670 in FIG. 20, the present example embodiment is not limited thereto, and any of the color filter 674, the planarization layer 676, and the common electrode 678 may be provided on the first substrate 610. Next, the liquid crystal layer LC is formed between the first substrate 610 and the second substrate 670.

In the display apparatuses 500 and 600 of FIGS. 19 and 20, the above-described inkjet printing method is used. Thus, a width of a film thickness varying region around an edge of a target region, for example, an edge of a display apparatus, may be reduced, and thus the display apparatuses 500 and 600 may be manufactured to each have a thin bezel.

By way of summation and review, in a general inkjet printing method, a plurality of inkjet heads are arranged over a target region to be printed, for example, a region of a display, and droplets with constant intervals and constant sizes are discharged onto the target region through nozzles of the inkjet heads.

The droplets discharged onto the target region spread out flat due to weights to form a thin film. In this case, some of the droplets ejected around an edge of the target region may spread beyond the target region, thereby having a non-uniform thickness around the edge of the target region and making a boundary unclear.

As a contactless printing technique, an inkjet printing method according to embodiments may be suitable for various applications.

As described above, according to the inkjet printing method, a thin film with better film thickness uniformity around an edge of a target region may be formed.

One or more embodiments include an inkjet printing method that may easily control a film thickness distribution.

According to the inkjet printing method, intervals and/or sizes of the droplets may be determined according to an area to be printed or a desired film thickness. An additional structure for controlling a film thickness may be omitted, and the process may be simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display apparatus, the method comprising:
   forming display devices in an array on a display substrate; and
   encapsulating the display substrate, encapsulating the display substrate including:
      setting a first region to be printed at a constant print density within a target region to be printed;
      setting a second region to be printed at a print density that varies according to position, wherein the second region is closer than the first region to an edge of the target region;
      generating control data for a plurality of nozzles provided on an inkjet head in order to print the first region and the second region; and
      driving the inkjet head according to the control data, wherein:
   the generating of the control data includes generating control data for printing the first region in a matrix form in which values of standard driving voltages respectively set for the plurality of nozzles are assigned to a row of the matrix so that a first direction in which the plurality of nozzles are disposed is defined as a direction of the row and the row is repeatedly disposed in a second direction in which the inkjet head moves relative to the target region.

2. The method as claimed in claim 1, wherein the display devices are organic light-emitting devices.

3. A method of manufacturing a display apparatus, the method comprising:
   forming a pixel circuit for controlling a display region and forming a pixel electrode on a first substrate; and
   forming a first alignment film on the first substrate, forming the first alignment film on the first substrate including:
      setting a first region to be printed at a constant print density within a target region to be printed;
      setting a second region to be printed at a print density that varies according to position, wherein the second region is closer than the first region to an edge of the target region;
      generating control data for a plurality of nozzles provided on an inkjet head in order to print the first region and the second region; and
      driving the inkjet head according to the control data, wherein:
   the generating of the control data includes generating control data for printing the first region in a matrix form in which values of standard driving voltages respectively set for the plurality of nozzles are assigned to a row of the matrix so that a first direction in which the plurality of nozzles are disposed is defined as a direction of the row and the row is repeatedly disposed in a second direction in which the inkjet head moves relative to the target region.

4. The method as claimed in claim 3, further comprising:
   forming a second alignment film on a second substrate in the same manner as the first alignment film; and
   forming a liquid crystal layer between the first substrate and the second substrate.

5. An inkjet printing method for controlling film thickness distribution, the method comprising:
   setting a first region to be printed at a constant print density within a target region to be printed;
   setting a second region within the target region and closer than the first region to an edge of the target region, wherein the second region is to be printed at a print density that varies according to position;
   generating control data for a plurality of nozzles provided on an inkjet head in order to print the first region and the second region; and
   driving the inkjet head according to the control data so as to print the first and second regions, wherein:
   the generating of the control data includes generating control data for printing the first region in a matrix form in which values of standard driving voltages respectively set for the plurality of nozzles are assigned to a row of the matrix so that a first direction in which the plurality of nozzles are disposed is defined as a direction of the row and the row is repeatedly disposed in a second direction in which the inkjet head moves relative to the target region.

6. The method as claimed in claim 5, wherein the print density of the second region is less than the print density of the first region.

7. The method as claimed in claim 6, wherein:
the target region is a region of a display substrate,
the edge of the target region corresponds to a bezel area of the display substrate, and
the print density of the second region decreases toward the edge of the target region.

8. The method as claimed in claim 5, wherein the first region and the second region are divided into a plurality of unit regions facing the plurality of nozzles provided on the inkjet head, and the control data is data for controlling intervals or volumes of droplets to be discharged onto the plurality of unit regions.

9. The method as claimed in claim 8, wherein the generating of the control data includes setting the standard driving voltage to satisfy a predetermined standard discharge amount tolerance range for the plurality of nozzles provided on the inkjet head.

10. The method as claimed in claim 9, wherein the generating of the control data further includes selecting a print density varying operation for the second region.

11. The method as claimed in claim 10, wherein the print density varying operation includes a droplet volume adjusting operation, a printing interval adjusting operation, or a combination thereof.

12. The method as claimed in claim 11, wherein the generating of the control data further includes generating control data for printing the second region by using data in a matrix form obtained by multiplying the bitmap data generated for each of the plurality of unit regions of the second region by the standard driving voltage set for the plurality of nozzles facing the plurality of unit regions.

13. An inkjet printing method for controlling film thickness distribution, the method comprising:
setting a first region to be printed at a constant print density within a target region to be printed;
setting a second region within the target region and closer than the first region to an edge of the target region, wherein the second region is to be printed at a print density that varies according to position;
generating control data for a plurality of nozzles provided on an inkjet head in order to print the first region and the second region; and
driving the inkjet head according to the control data so as to print the first and second regions,
wherein the generating of the control data further includes selecting a print density varying operation for the second region,
wherein a droplet volume adjusting operation is selected as the print density varying operation, and the generating of the control data further includes setting a ratio of an amount of droplets to be discharged onto the plurality of unit regions of the second region to a standard discharge amount.

14. The method as claimed in claim 13, wherein the generating of the control data further includes generating control data for printing the second region by using data in a matrix form obtained by multiplying the ratio set for each of the plurality of unit regions of the second region by the standard driving voltage set for the plurality of nozzles facing the plurality of unit regions.

15. An inkjet printing method for controlling film thickness distribution, the method comprising:
setting a first region to be printed at a constant print density within a target region to be printed;
setting a second region within the target region and closer than the first region to an edge of the target region, wherein the second region is to be printed at a print density that varies according to position;
generating control data for a plurality of nozzles provided on an inkjet head in order to print the first region and the second region; and
driving the inkjet head according to the control data so as to print the first and second regions,
wherein the generating of the control data further includes selecting a print density varying operation for the second region,
wherein a printing interval adjusting operation is selected as the print density varying operation, and the generating of the control data further includes setting an interval ratio of an interval of discharging droplets onto the second region to an interval between droplets to be discharged onto the first region.

16. The method as claimed in claim 15, wherein the generating of the control data further includes generating bitmap data indicating unit regions onto which droplets are to be discharged, from among the plurality of unit regions of the second region, the data having values of 1 and 0 according to the interval ratio.

17. An inkjet printing method for controlling film thickness distribution, the method comprising:
setting a first region to be printed at a constant print density within a target region to be printed;
setting a second region within the target region and closer than the first region to an edge of the target region, wherein the second region is to be printed at a print density that varies according to position;
generating control data for a plurality of nozzles provided on an inkjet head in order to print the first region and the second region; and
driving the inkjet head according to the control data so as to print the first and second regions,
wherein the generating of the control data further includes selecting a print density varying operation for the second region,
wherein a combination of a droplet volume adjusting operation and a printing interval adjusting operation is selected as the print density varying operation, and the generating of the control data further includes:
setting a ratio of an amount of droplets to be discharged onto the plurality of unit regions of the second region to a standard discharge amount; and
setting an interval ratio of an interval of discharging droplets onto the second region to an interval of discharging droplets onto the first region.

18. The method as claimed in claim 17, wherein the generating of the control data further includes forming bitmap data according to the interval ratio, the bitmap data indicating unit regions onto which droplets are to be discharged as value of 1, and indicating unit regions onto which droplets are not to be discharged as value of 0, from among the plurality of unit regions of the second region.

19. The method as claimed in claim 18, wherein the generating of the control data includes generating control data for printing the second region by using data in a matrix form obtained by multiplying the bitmap data generated for each of the plurality of unit regions of the second region, the ratio of an amount of droplets to be discharged onto each of the plurality of unit regions of the second region to a standard discharge amount, and the standard driving voltages for the plurality of nozzles facing the plurality of unit regions.

\* \* \* \* \*

UNITED STATES PATENT AND TRADEMARK OFFICE
CERTIFICATE OF CORRECTION

PATENT NO. : 9,931,838 B2  
APPLICATION NO. : 15/254019  
DATED : April 3, 2018  
INVENTOR(S) : Dongjun Lee et al.

Page 1 of 1

It is certified that error appears in the above-identified patent and that said Letters Patent is hereby corrected as shown below:

On the Title Page

Item (73) (Assignee), Reads:  
"SAMSUNG DISPLAY CO., LTD., Yongin-Si, Gyeonggi-Do (KR)"  
Should Read:  
"SAMSUNG DISPLAY CO., LTD., Yongin-Si, Gyeonggi-Do (KR); SAMSUNG ELECTRONICS CO., LTD., Suwon-Si, Gyeonggi-Do (KR)"

Signed and Sealed this  
Thirty-first Day of December, 2019

Andrei Iancu  
*Director of the United States Patent and Trademark Office*